US 9,685,857 B2

(12) United States Patent
Barauna et al.

(10) Patent No.: US 9,685,857 B2
(45) Date of Patent: Jun. 20, 2017

(54) CONTROL DEVICE TO CONTROL A DC/DC CONVERTER IN A SWITCHED ELECTRICAL POWER SUPPLY SYSTEM WHILE LIMITING A CAPACITANCE THEREOF

(71) Applicant: Schneider Toshiba Inverter Europe SAS, Pacy sur Eure (FR)

(72) Inventors: Allan Barauna, Vernon (FR); Hocine Boulharts, Triel sur Seine (FR)

(73) Assignee: SCHNEIDER TOSHIBA INVERTER EUROPE SAS, Pacy sur Eure (FR)

( * ) Notice: Subject to any disclaimer, the term of this patent is extended or adjusted under 35 U.S.C. 154(b) by 2 days.

(21) Appl. No.: 14/176,467

(22) Filed: Feb. 10, 2014

(65) Prior Publication Data

US 2014/0241015 A1 Aug. 28, 2014

(30) Foreign Application Priority Data

Feb. 25, 2013 (FR) ...................................... 13 51622

(51) Int. Cl.
*H02M 5/45* (2006.01)
*H02M 3/156* (2006.01)
(Continued)

(52) U.S. Cl.
CPC ........... *H02M 3/156* (2013.01); *H02M 5/458* (2013.01); *H03K 17/102* (2013.01); *H03K 17/74* (2013.01)

(58) Field of Classification Search
CPC ...... H02M 3/156; H02M 5/458; H03K 17/74; H03K 17/102
(Continued)

(56) References Cited

U.S. PATENT DOCUMENTS 4,692,643 A * 9/1987 Tokunaga ............ H03K 17/102
327/436
5,148,064 A * 9/1992 Kevorkian ........... H03K 17/102
327/427
(Continued)

FOREIGN PATENT DOCUMENTS

EP   0 140 349 A2   5/1985
EP   0 453 376 A2   10/1991

OTHER PUBLICATIONS

French Preliminary Search Report and Written Opinion issued Oct. 18, 2013, in Patent Application No. FR 1351622, filed Feb. 25, 2013.
(Continued)

*Primary Examiner* — Adolf Berhane
*Assistant Examiner* — Afework Demisse
(74) *Attorney, Agent, or Firm* — Oblon, McClelland, Maier & Neustadt, L.L.P.

(57) ABSTRACT

The invention relates to a control device (1) employed in a switched electrical power supply system to control a DC/DC converter of said switched electrical power supply system, said control device comprising a first input terminal (A) and a second input terminal (B), a first transistor (T1) connected via its source to the second input terminal (B) and a second transistor (T2) furnished with a gate (G) and connected via its drain (D) to the first input terminal (A), and via its source (S) to the first transistor (T1), the control device comprising a control assembly connected to the gate (G) of the second transistor (T2) and to the second input terminal (B) and comprising a capacitor (Ca) and a first Zener diode (Dz1) connected in series to said capacitor (Ca) and a second Zener diode (Dz2) connected between the gate (G) and the source (S) of the second transistor (T2).

9 Claims, 4 Drawing Sheets

(51) Int. Cl.
*H03K 17/10* (2006.01)
*H03K 17/74* (2006.01)
*H02M 5/458* (2006.01)

(58) Field of Classification Search
USPC ....... 323/222, 223, 224, 225, 282, 284, 285;
363/21.01–21.06, 21.12–21.18, 16, 19,
363/60, 70, 71
See application file for complete search history.

(56) References Cited

U.S. PATENT DOCUMENTS

| | | | |
|---|---|---|---|
| 2008/0310189 A1* | 12/2008 | Nilsson | 363/16 |
| 2011/0234196 A1* | 9/2011 | Chiba | H01L 23/50 |
| | | | 323/311 |
| 2012/0081932 A1* | 4/2012 | Videt | H02M 1/44 |
| | | | 363/35 |
| 2013/0258721 A1 | 10/2013 | Boulharts et al. | |
| 2015/0049006 A1* | 2/2015 | Sun | G09G 3/3266 |
| | | | 345/76 |

OTHER PUBLICATIONS

Herbert L. Hess, et al., "Transformerless Capacitive Coupling of Gate Signals for Series Operation of Power MOS Devices", IEEE Transactions on Power Electronics, vol. 15, No. 5, XP 011043472, Sep. 2000, pp. 923-930.

* cited by examiner

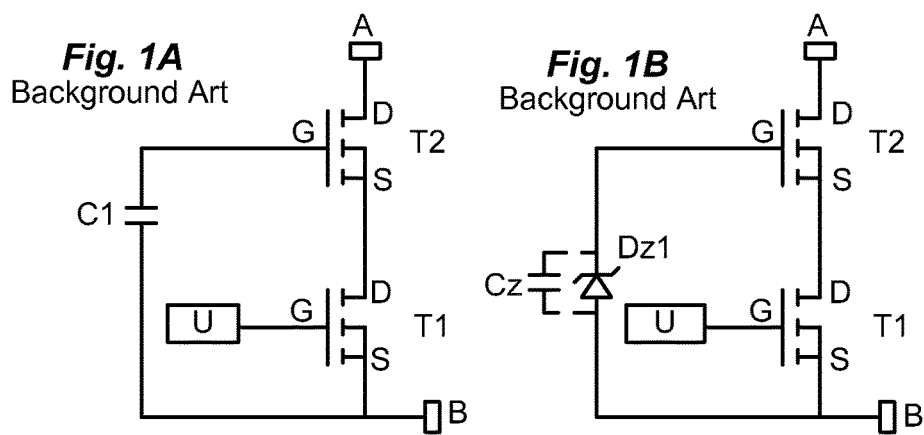
Fig. 1A Background Art
Fig. 1B Background Art
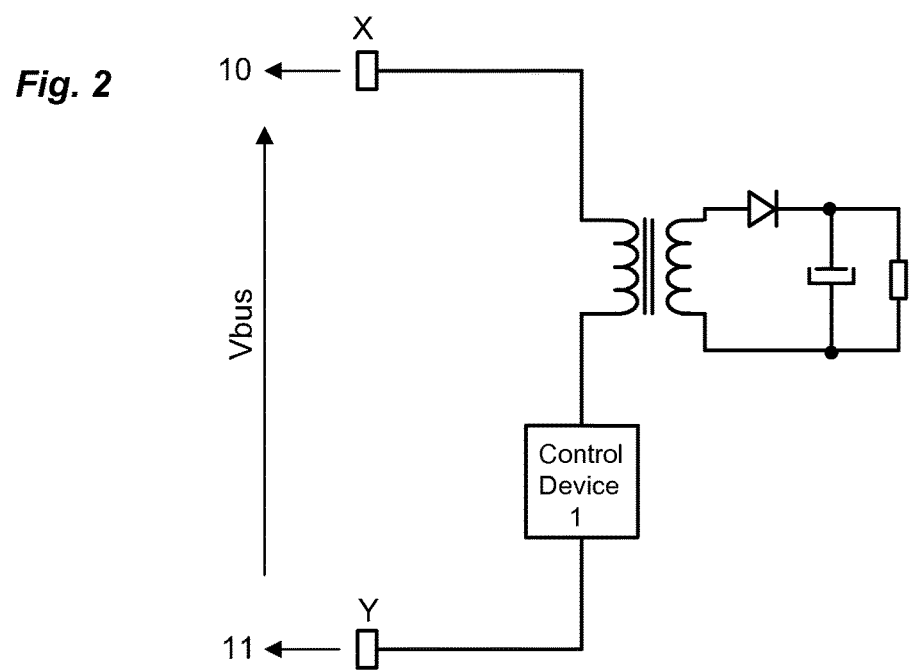
Fig. 2
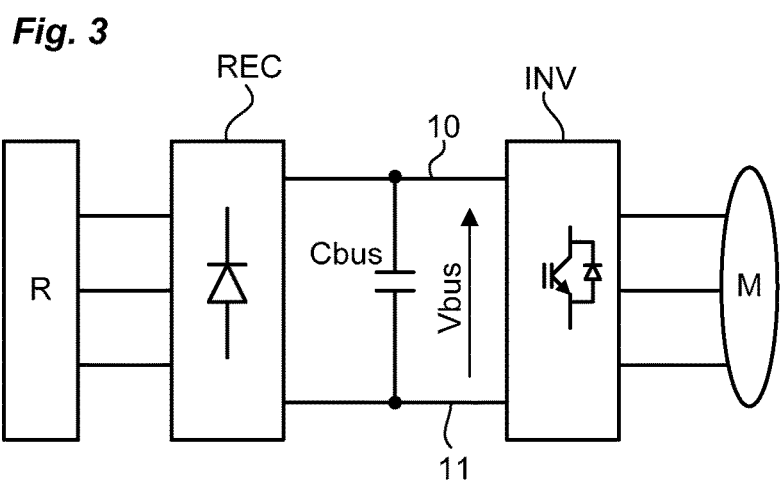
Fig. 3

CONTROL DEVICE TO CONTROL A DC/DC CONVERTER IN A SWITCHED ELECTRICAL POWER SUPPLY SYSTEM WHILE LIMITING A CAPACITANCE THEREOF

TECHNICAL FIELD OF THE INVENTION

The present invention pertains to a control device employed in a switched electrical power supply system.

PRIOR ART

A switched electrical power supply system (also called SMPS for "Switched Mode Power Supply") makes it possible to deliver as output one or more DC voltages on the basis of a DC voltage tapped off at input. This type of switched electrical power supply system is in particular employed in a variable speed drive. In a variable speed drive, the switched electrical power supply system is then charged with providing an auxiliary DC voltage making it possible to power all the electronics of the variable speed drive, from a main DC voltage tapped off from the DC power supply bus of the variable speed drive.

The DC power supply bus provides a main DC voltage that may range from 350 Vcc to more than 1000 Vcc. The control device employed in the switched electrical power supply system must thus be able to switch a current of up to 2 A under 1700 Vcc. In a known manner, the control device can comprise a single transistor of MOSFET type having a breakdown voltage of between 1200 V and 1700V. However, at these breakdown voltages, the MOSFET transistor is at its technological limits. Moreover, its cost is high and, during operation, its losses through the Joule effect are particularly high.

To alleviate these drawbacks, it is known to associate two MOSFET transistors in series, having lower breakdown voltages, ranging from 600V to 900V. Each of the two transistors in series thus supports a lesser electrical voltage, compatible with optimal employment of MOSFET technology.

In the prior art, several setups with two transistors in series have been proposed. The publication entitled "*Transformerless Capacitive Coupling of Gate Signals for Series Operation of Power MOS Devices*"—Robert L. Hess and Russel Jacob Baker—IEEE transactions on power electronics, vol. 15, No. 5, September 2000, describes a control device comprising at least two transistors of MOSFET type in series. This topology is represented in FIG. 1A. In this topology, the control device comprises two input terminals A, B and a first transistor T1 connected to the second input terminal B and receiving on its gate control signals originating from a control unit U. A second transistor T2 is connected in series with the first transistor T1 and to the first input terminal A. A capacitor C1 is connected between the gate of the second transistor T2 and the first input terminal A. The role of the capacitor C1 is two-fold: provide enough charge to control the second transistor and limit the voltage across the terminals of the first transistor to an optimal value.

So as not to be contingent on these two conditions, it has in particular been proposed to replace the capacitor by a Zener diode Dz1, which then makes it possible to fix the voltage across the terminals of the first transistor T1. This second known topology is represented in FIG. 1B. In this setup, the control of the second transistor T2 is then ensured by virtue of the charge stored up by the stray capacitance (Cz) of the Zener diode Dz1. However, if the charge transmitted by the stray capacitance of the Zener diode Dz1 is lower (due for example to too low a voltage of the DC bus) than the charge necessary to correctly control the second transistor T2, it is then necessary to add a capacitor in parallel with this Zener diode to ensure suitable control of the second transistor. By adding the capacitor in parallel with the Zener diode, the drawbacks identified in respect of the first setup make their reappearance.

In these two setups, the control of the second transistor T2 depends on the capacitance of the capacitor, whether the latter be intrinsic or additional, and the level of the voltage across the terminals of the capacitor. To control the second transistor T2 in an suitable manner, on the basis of a voltage which is low across the terminals of the capacitor (intrinsic to the Zener diode Dz1 or additional), it is necessary to increase the capacitance of the capacitor connected in series to the gate G of the transistor T2. However, the capacitance of the capacitor cannot be increased indefinitely.

Various control solutions have been described in patent applications EP0453376A2 and EP0140349A2 as well as in the publication by Herbert L Hess entitled "Transformerless Capacitive coupling of Gate Signals for Series Operation of Power MOS Devices" of 1 Sep. 2000—XP011043472.

The aim of the invention is to propose a control device with two transistors in series, intended to be employed in a switched electrical power supply system, the control device allowing suitable control of the second transistor whatever the level of the main DC voltage, and without increasing the capacitance of a capacitor.

DISCLOSURE OF THE INVENTION

This aim is achieved by a control device intended to be employed in a switched electrical power supply system to control a DC/DC converter of said switched electrical power supply system, said control device comprising a first input terminal and a second input terminal, a first transistor connected via its source to the second input terminal and furnished with a gate intended to receive control signals originating from a control unit and a second transistor furnished with a gate and connected via its drain to the first input terminal and via its source to the first transistor, characterized in that the control device comprises:
  a control assembly connected to the gate of the second transistor and to the second input terminal and comprising a capacitor and a voltage clipping/routing device connected in series to said capacitor,
  a Zener diode connected between the gate and the source of the second transistor.

According to a particular feature, the device comprises one or more superimposed identical patterns, each pattern comprising:
  two connection points,
  a capacitor connected to a first connection point,
  a first Zener diode connected in series with said capacitor,
  a third transistor furnished with a gate connected to said capacitor and with a source connected to a second connection point,
  a Zener diode connected between the gate and the source of the third transistor,
  the first added pattern being connected up by its second connection point to the drain of the second transistor and by its first connection point to the gate of the second transistor,
  each additional pattern being connected up by its second connection point to the drain of the transistor of the previous pattern and by its first connection point to the gate of the transistor of the previous pattern.

The invention also relates to a switched electrical power supply system comprising a first terminal and a second terminal between which is connected a DC voltage source, a DC/DC converter connected to the first terminal and a control device connected in series with the DC/DC converter and to the second terminal, said control device being in accordance with that defined hereinabove.

According to a particular feature, the DC/DC converter is of insulated "flyback" type, of insulated "forward" type, of step-up type or of step-down type.

The invention finally relates to a variable speed drive intended to control an electrical load, said variable drive comprising:
- a rectifier module intended to rectify an AC voltage provided by an electrical distribution network,
- a DC power supply bus connected to the rectifier module and comprising a first power supply line at positive electrical potential and a second power supply line at negative electrical potential between which is applied a main DC voltage provided by the rectifier module,
- a bus capacitor connected to the first power supply line and to the second power supply line,
- an inverter module comprising several switching transistors intended to convert the DC voltage available on the bus into a variable voltage destined for the electrical load,
- a switched electrical power supply system in accordance with that defined hereinabove, the first terminal of the switched electrical power supply system being connected to the first power supply line of the DC power supply bus and the second terminal of the switched electrical power supply system being connected to the second power supply line of the DC power supply bus.

BRIEF DESCRIPTION OF THE FIGURES

Other characteristics and advantages will become apparent in the detailed description which follows given with regard to the appended drawings in which:

FIG. 1A represents a control device with two transistors in series, according to a first prior art, FIG. 1B represents a control device with two transistors in series, according to a second prior art, FIG. 2 represents a switched electrical power supply system, FIG. 3 represents a variable speed drive employing a switched electrical power supply system of the invention.

DETAILED DESCRIPTION OF AT LEAST ONE EMBODIMENT

The solutions presented in FIGS. 1A and 1B form part of the prior art and have been described hereinabove, in the introductory part of the description.

In the subsequent description, certain references employed in the description of FIGS. 1A and 1B are preserved for the description of the invention, in so far as the components employed are identical and fulfil an identical function.

The invention relates to a control device 1 intended to be employed in a switched electrical power supply system. Such a switched electrical power supply system is employed in a variable speed drive, such as represented in FIG. 3.

With reference to FIG. 3, a variable speed drive is powered from a three-phase electrical power supply network R delivering an AC voltage and is based on an AC/DC/AC topology (AC=Alternating Current, DC=Direct Current). A variable speed drive such as this thus comprises:
- a rectifier module REC intended to rectify the AC voltage provided by the network,
- a DC power supply bus connected to the rectifier module and comprising a first power supply line 10 at positive electrical potential and a second power supply line 11 at negative electrical potential between which is applied a main DC voltage Vbus provided by the rectifier module,
- a bus capacitor Cbus connected to the first power supply line 10 and to the second power supply line 11 and intended to maintain the DC voltage Vbus at a constant value,
- an inverter module INV comprising several switching transistors intended to convert the DC voltage available on the bus into a variable voltage destined for an electrical load M.

The main DC voltage Vbus is employed to power the switched electrical power supply system. The switched electrical power supply system is in particular employed to provide a control voltage to the transistors of the inverter module INV.

A switched electrical power supply system, such as represented in FIG. 2, comprises a first terminal X intended to be connected to the first power supply line 10 and a second terminal Y intended to be connected to the second power supply line 11 of the DC power supply bus. The system comprises a DC/DC converter connected to its first terminal X and a control device 1 connected in series with the DC/DC converter and to its second terminal Y. The DC/DC converter can take the form of various known topologies, such as for example insulated "flyback", insulated "forward", step-down ("buck") or step-up ("boost"). FIG. 2 shows the association of the control device of the invention with a converter of "flyback" type.

Figure 4:
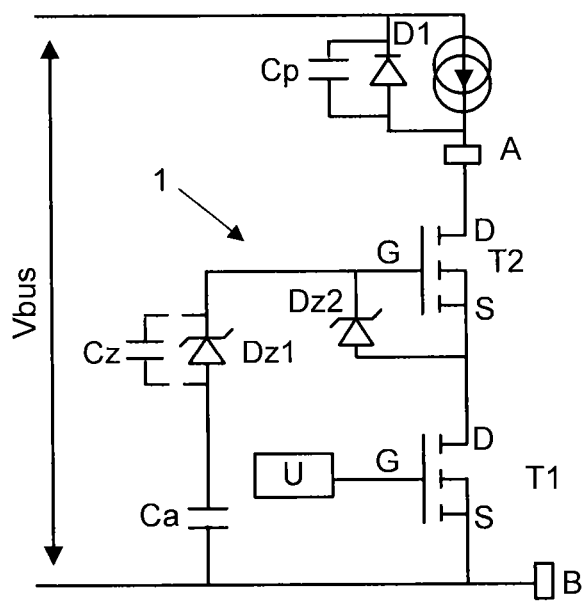
FIG. 4 represents a control device with two transistors in series, according to the invention, combined with a converter of voltage step-down type.

With reference to FIG. 4, the control device 1 of the invention, combined with a converter of voltage step-down type, comprises two input terminals A, B. The first input terminal A is intended to be connected to the voltage step-down converter of the switched electrical power supply system and the second input terminal B is intended to be connected to the second terminal Y of the system.

The control device 1 comprises two transistors T1, T2 connected in series between its first input terminal A and its second input terminal B. Preferably, each of the transistors is a MOSFET, an IGBT or a transistor fabricated in a material with a large forbidden band energy ("wide-band gap material") such as silicon carbide or gallium nitride. Choosing two transistors in series makes it possible to halve the voltage supported across the terminals of each of the transistors, and therefore to decrease their cost and their bulk with respect to a single transistor supporting the entire voltage.

Each transistor T1, T2 possesses a gate G whose control enables a current to be passed between a drain D and a source S. As represented in FIG. 4, the source S of the first transistor T1 is connected to the second input terminal B, the source S of the second transistor T2 is connected to the drain D of the first transistor T1 and the drain of the second transistor T2 is connected to the first input terminal A.

The gate G of the first transistor T1 is connected to a control unit U delivering control signals, for example of PWM (Pulse Width Modulation) type, to turn the first transistor T1 on or off. The gate G of the second transistor T2 is of floating-control type. Thus, it is connected to the second input terminal B through a specific control assembly, the subject of the invention.

This control assembly comprises a capacitor Ca connected in series to the second input terminal B and a clipping/routing device, a Zener diode Dz1, for example, connected to the capacitor Ca and to the gate G of the second transistor T2. The Zener diode Dz1 is connected in series with the capacitor Ca.

The control assembly also comprises a second Zener diode Dz2 connected between the gate G and the source S of the second transistor T2.

The capacitor Ca is thus auto-supplied by the discharging of the gate G of the second transistor T2 and by the charging of the drain-source stray capacitance Co2 of the transistor T2. This auto-power supply occurs during the turn-off phase of the first transistor T1. During this phase, the Zener diode Dz1 is clamped and conducts in reverse.

The turn-off phase and the turn-on phase of the control assembly are explained hereinbelow:

Turning-Off Phase:

Initially, both transistors T1, T2 are on.

Figure 5A:
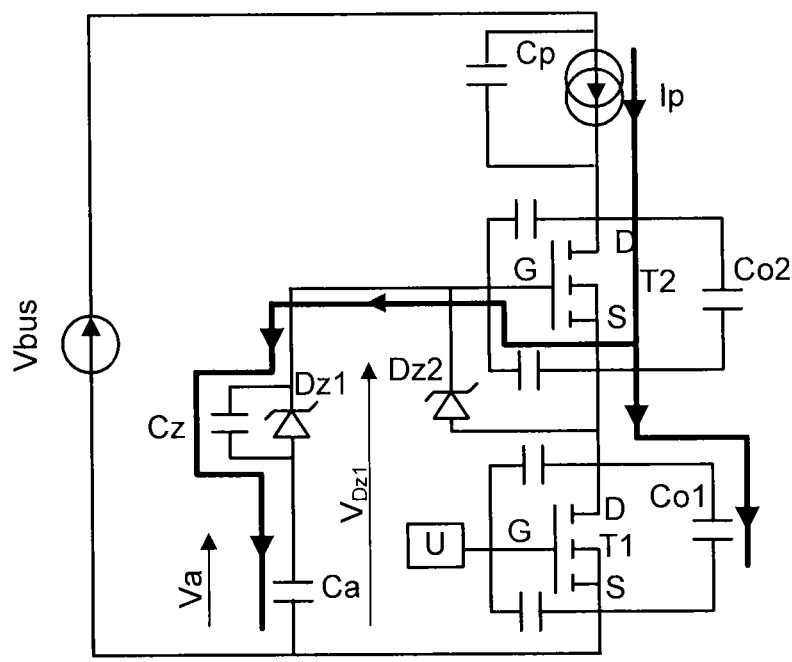
FIGS. 5A to 5C illustrate the modus operandi of the control device of the invention.

FIG. 5A: The control unit U dispatches a turn-off signal on the gate G of the first transistor T1. The Drain-Source voltage $V_{DS1}$ of the first transistor T1 begins to increase, bringing about an increase in the voltage $V_{Dz1}$ across the terminals of the Zener diode Dz1. The current Ip (primary current of the transformer) flows through the gate G of the second transistor T2 and charges the stray capacitances, Cz of the Zener diode Dz1, Co1 of the first transistor T1 and the capacitance of the capacitor Ca and discharges the stray capacitance Cp of the diode D1 of the converter. This current Ip allows an increase in the voltage $V_{Dz1}$ across the terminals of the Zener diode Dz1 and in the voltage Va across the terminals of the capacitor Ca. It also allows the discharging of the gate G of the second transistor T2. The second transistor T2 is, however, still in the conducting state.

Figure 5B:
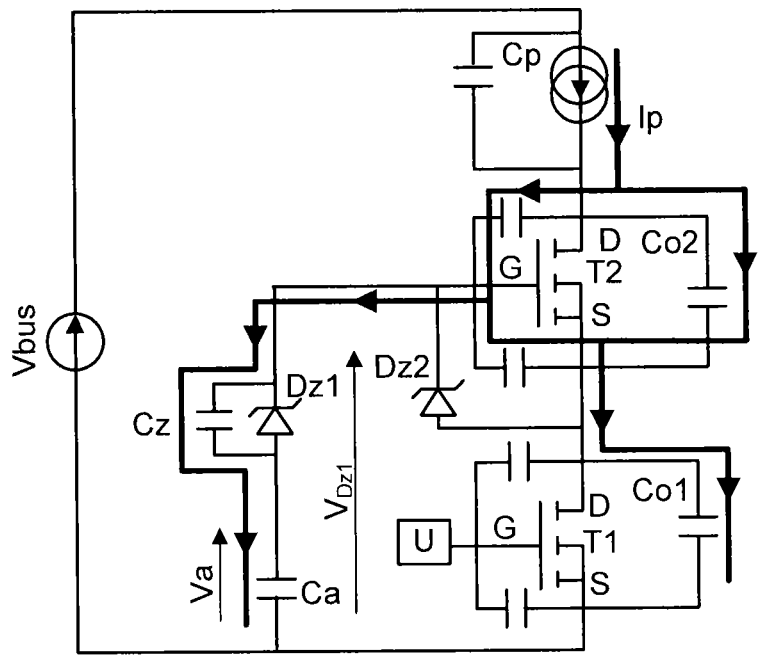

FIG. 5B: As soon as the Gate-Source voltage $V_{GS2}$ of the second transistor T2 drops below the change-of-state limit voltage, the second transistor T2 passes to the open state, bringing about the increase in its Drain-Source voltage $V_{DS2}$. When the second transistor T2 is in the open state, the current Ip charges the stray capacitances Co1, Co2, Cz and continues to discharge the gate of the second transistor T2 and the stray capacitance Cp.

Figure 5C:
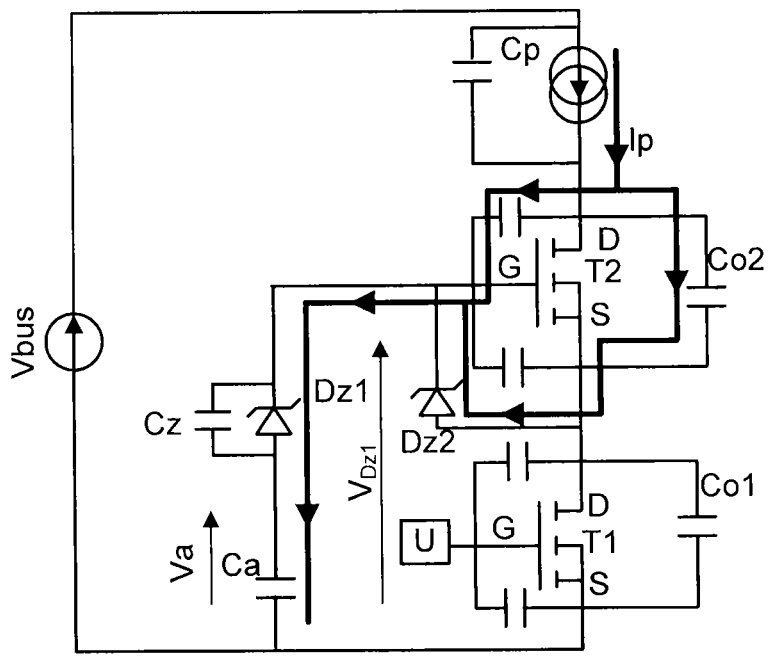

FIG. 5C: Once the Drain-Source voltage of the first transistor T1 $V_{DS1}$ has reached the clamping voltage of the Zener diode Dz1, the charging of the stray capacitor Co1 of the transistor T1 is terminated and the current $I_{DS1}$ going through the first transistor T1 becomes zero.

The current Ip continues the charging and the discharging of the stray capacitances Co2, Cp respectively of the second transistor T2 and of the diode D1 as long as they are not fully charged. The Zener diode Dz2 conducts in forward mode and the Zener diode Dz1 conducts in reverse mode until the respective complete charging and discharging of the stray capacitances Co2, Cp.

Turning-On Phase:

Initially, both transistors T1, T2 are off.

The control unit U dispatches a turn-on signal on the gate of the first transistor T1. The Drain-Source voltage $V_{DS1}$ across the terminals of the first transistor T1 drops until the full conduction of the first transistor, representing its resistive state.

The voltage Va across the terminals of the capacitor Ca is then sufficient to correctly pilot the second transistor T2. This auto-adaptive voltage Va is expressed in the following manner:

$$Va = Vfw_{Dz1} + V_{Dz2} + (Id_{T1} * RdS_{ON\_T1})$$

In which:

Va represents the voltage across the terminals of the capacitor Ca, $Vfw_{Dz1}$ represents the forward conduction threshold voltage of the Zener diode Dz1, $V_{Dz2}$ represents the clamping voltage of the Zener diode Dz2, $Id_{T1}$ represents the Drain-Source current going through the first transistor T1, $Rds_{ON\_T1}$ represents the conducting state resistance of the first transistor T1.

Starting from the architecture described hereinabove, the invention also consists in cascading transistors above the second transistor T2.

To do this, it is possible to superimpose one or more identical patterns on the architecture described previously and comprising the two transistors T1, T2. The first pattern is connected to the gate G and to the drain D of the second transistor T2.

Figure 6:
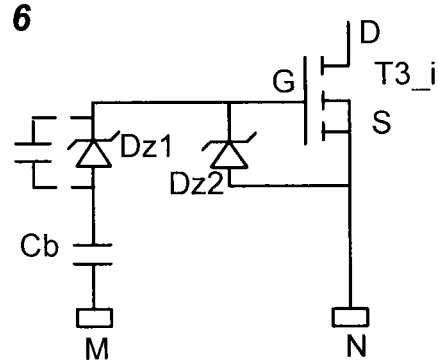
FIG. 6 represents a pattern that can be cascaded several times on the control device of the invention.
Figure 7:
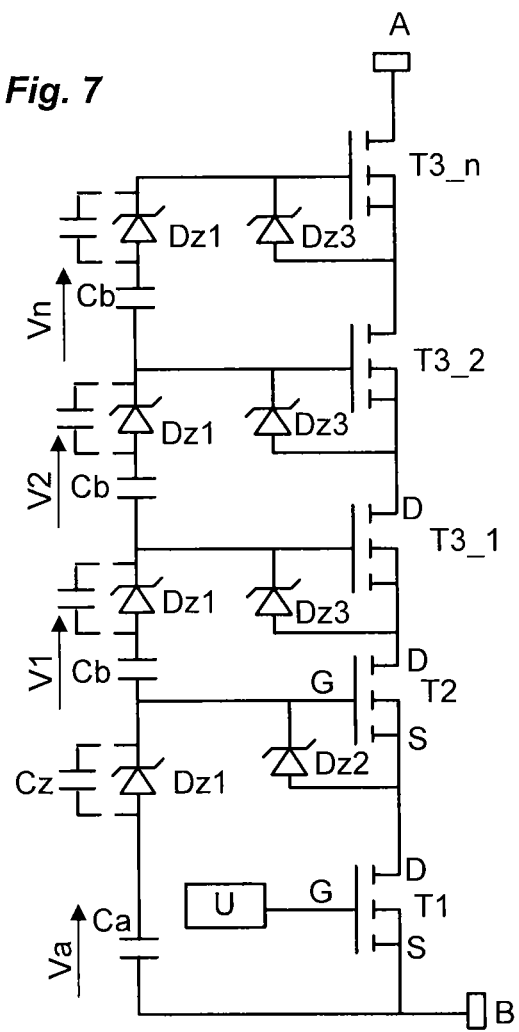
FIG. 7 represents a control device of the invention, comprising several transistors in cascade.

With reference to FIG. 6, a pattern comprises two connection points M, N. Each pattern comprises a capacitor Cb, which may be identical to the capacitor Ca mentioned above, connected to a first connection point M, a Zener diode Dz1, identical to the previous one so as to comply with the sharing of the voltages, connected in series with the capacitor Cb, a transistor T3_i (i=1 to n), of the same type as the main transistors T1, T2, whose gate G is connected to the capacitor Cb, and whose source S is connected to a second connection point N. The pattern also comprises a Zener diode Dz3 (optionally identical to Dz2) connected between the gate G and the source S of the transistor T3_i.

Each added pattern is connected up by its second connection point N to the drain D of the transistor (T3_n−1) of the previous pattern and by its first connection point M to the gate G of the transistor (T3_n−1) of the previous pattern.

The drain D of the transistor of the last pattern (T3_n) is connected to the first input terminal A described hereinabove.

When the first transistor T1 is turned off by the control unit U, the stray capacitances of the transistors in cascade are charged by the current Ip. The voltage across the terminals of each transistor T3_i is clipped to the voltage of its Zener diode Dz1. The Zener diodes conduct and charge the capacitors Cb of the patterns.

Upon turning on, the voltage across the terminals of each capacitor Cb of the patterns compensates for the voltage drops. This voltage V1 across the terminals of each capacitor Cb of a pattern is expressed in the following manner:

$$V1 = (V_{DZ3} - V_{Dz2}) + Vfw_{Dz1} + Id_{T2} * Rds_{on\_T2}$$

$$Vn = (V_{DZ3} - V_{Dz2}) + Vfw_{Dz1} + Id_{Tn-1} * Rds_{on\_Tn}$$

If VDz3=VDz2, and the conducting state resistances of the transistors are identical ($Rds_{on\_Tn}$), we then obtain:

$$V1 = V2 = Vn = Vfw_{Dz1} + Id_{T2} * Rds_{on\_Tn}$$

Employing a so-called "floating" capacitor in the cascading of more than two transistors of MOSFET type makes it possible to compensate the voltage drops of the associated Zener diodes Dz1 and the voltage drop related to the conducting state resistance of the transistor.

The invention claimed is:

1. A control device in a switched electrical power supply system that controls a DC/DC converter of said switched electrical power supply system, said control device comprising:
 a first input terminal and a second input terminal;
 a first transistor connected via a source thereof to the second input terminal, a gate of the first transistor being configured to receive control signals originating from a controller;
 a second transistor connected via a drain thereof to the first input terminal, a source thereof being connected to a drain of the first transistor;
 a control assembly connected between a gate of the second transistor and the second input terminal, the control assembly including a capacitor and a voltage clipping/routing device connected in series to said capacitor; and
 a Zener diode having a cathode connected to the gate of the second transistor and an anode connected to the source of the second transistor,
 wherein the gate of the first transistor is connected to a terminal that is separate from gate connections to the second transistor.

2. The control device according to claim 1, wherein the voltage clipping/routing device includes another Zener diode.

3. The control device according to claim 1, further comprising one or more superimposed identical patterns, each pattern including:
 two connection points,
 a capacitor connected to a first connection point,
 a first Zener diode connected in series with said capacitor,
 a third transistor including a gate connected to said capacitor and with a source connected to a second connection point,
 a Zener diode connected between the gate and the source of the third transistor,
 a first of the one or more superimposed identical patterns being connected via a second connection point thereof to the drain of the second transistor and by a first connection point thereof to the gate of the second transistor,
 each additional one of the one or more superimposed identical patterns being connected by a second second connection point thereof to a drain of a third transistor of a previous one of the one or more superimposed identical patterns and by a first connection point thereof to a gate of the third transistor of the previous one of the one or more superimposed identical patterns.

4. A switched electrical power supply system comprising:
 a first terminal and a second terminal between which is connected a DC voltage source, and
 a DC/DC converter connected to the first terminal and a control device connected in series with the DC/DC converter and to the second terminal, said control device being a control device according to claim 1.

5. The switched electrical power supply system according to claim 4, wherein the DC/DC converter is an insulated flyback DC/DC converter.

6. The switched electrical power supply system according to claim 4, wherein the DC/DC converter is an insulated forward DC/DC converter.

7. The switched electrical power supply system according to claim 4, wherein the DC/DC converter is a step-up DC/DC converter.

8. The switched electrical power supply system according to claim 4, wherein the DC/DC converter is a step-down DC/DC converter.

9. A variable speed drive that controls an electrical load, comprising:
 a rectifier module configured to rectify an AC voltage provided by an electrical distribution network;
 a DC power supply bus connected to the rectifier module and including a first power supply line at positive electrical potential and a second power supply line at negative electrical potential between which is applied a main DC voltage provided by the rectifier module;
 a bus capacitor connected to the first power supply line and to the second power supply line;
 an inverter module including a plurality switching transistors configured to convert the DC voltage available on the bus into a variable voltage to be provided to the electrical load; and
 a switched electrical power supply system according to claim 4, wherein the first terminal of the switched electrical power supply system is connected to the first power supply line of the DC power supply bus and the second terminal of the switched electrical power supply system is connected to the second power supply line of the DC power supply bus.

* * * * *